United States Patent
Cucchi et al.

(10) Patent No.: US 7,127,658 B2
(45) Date of Patent: Oct. 24, 2006

(54) METHOD AND ENCODER FOR IMPLEMENTING A FULLY PROTECTED MULTIDIMENSIONAL LINEAR BLOCK CODE

(75) Inventors: Silvio Cucchi, Gaggiano (IT); Carlo Costantini, Casatenovo (IT)

(73) Assignee: Alcatel, Paris (FR)

( * ) Notice: Subject to any disclaimer, the term of this patent is extended or adjusted under 35 U.S.C. 154(b) by 278 days.

(21) Appl. No.: 10/622,551

(22) Filed: Jul. 21, 2003

(65) Prior Publication Data

US 2004/0059981 A1     Mar. 25, 2004

(30) Foreign Application Priority Data

Sep. 20, 2002   (EP)   .................. 02292309

(51) Int. Cl.
  *H03M 13/27*   (2006.01)
  *H03M 13/29*   (2006.01)
(52) U.S. Cl. .................................. 714/755
(58) Field of Classification Search ............ 714/755, 714/756
See application file for complete search history.

(56) References Cited

U.S. PATENT DOCUMENTS

| | | | | |
|---|---|---|---|---|
| 4,356,564 A | * | 10/1982 | Doi et al. | 714/755 |
| 4,569,051 A | * | 2/1986 | Wilkinson | 714/755 |
| 4,598,403 A | * | 7/1986 | Odaka | 714/756 |
| 4,665,537 A | * | 5/1987 | Moriyama | 714/755 |
| 5,060,221 A | * | 10/1991 | Sako et al. | 369/59.25 |
| 6,289,468 B1 | * | 9/2001 | Godfrey | 713/401 |

OTHER PUBLICATIONS

S. Benedetto et al, "Unveiling Turbo Codes: Some results on Parallel Concatenated Coding Schemes" IEEE Transactions on Information Theory, IEEE Inc. New York, US vol. 42, No. 2, Mar. 1996, pp. 409-428, XP000850506.

* cited by examiner

*Primary Examiner*—Stephen M. Baker
(74) *Attorney, Agent, or Firm*—Sughrue Mion, PLLC

(57) ABSTRACT

A method is described for implementing a multidimensional linear block code on a frame of information symbols to be transmitted through a transmission system, the information symbols being organized in a frame with a number of columns and a number of rows. The method includes the steps of adding to the frame of information symbols a number of columns of redundancy symbols of a length equal to the number of rows of the frame of symbols to be transmitted; and of identifying the horizontal sequences, or rows, of information symbols and redundancy symbols as first code words. The redundancy symbols are constructed in such a way that, by interleaving the frame of information symbols and redundancy symbols, using a permutation of the elements within the columns, the rows of information symbols and redundancy symbols produced from the permuted columns form second code words. Conveniently, such operation may be repeated to obtain multidimensional codes.

9 Claims, 4 Drawing Sheets

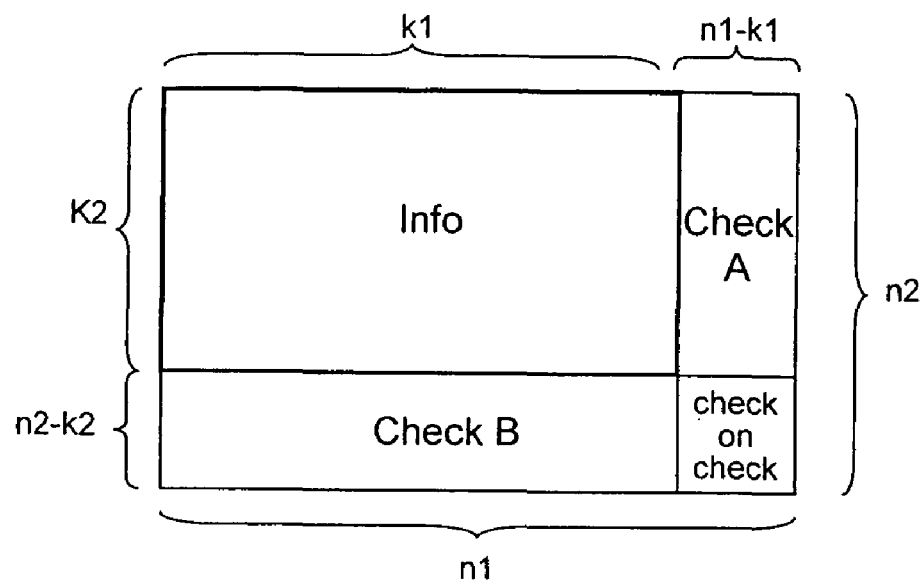
Fig. 1 (prior-art)
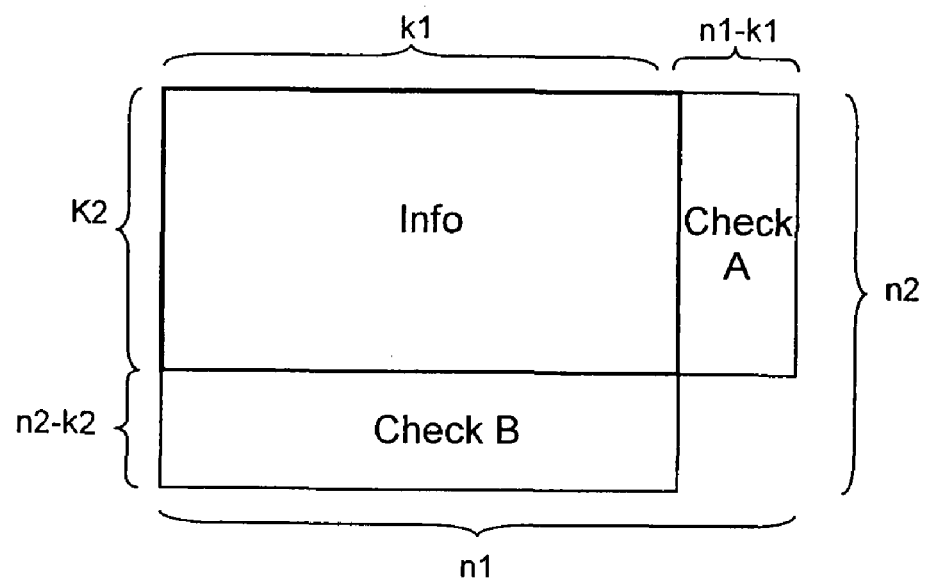
Fig. 2a (prior-art)

Fig. 3a, Fig. 3b, Fig. 3c

METHOD AND ENCODER FOR IMPLEMENTING A FULLY PROTECTED MULTIDIMENSIONAL LINEAR BLOCK CODE

INCORPORATION BY REFERENCE OF PRIORITY DOCUMENT

This application is based on, and claims the benefit of, the European Patent Application No. 02 292 309.8 filed on Sep. 20, 2002, which is incorporated by reference herein.

BACKGROUND OF THE INVENTION

1. Field of the Invention

The present invention relates to the field of the correction of errors that may have been generated during the transmission of a signal. In particular, it concerns a method and an encoder for implementing a Linear Block Code (LBC) characterised by a great length and a correcting capacity higher than that of the known solutions.

2. Description of the Prior Art

Linear block codes are known, and their use in the field of telecommunications is also known. In order to implement the code, an encoder is provided at the transmitting end and a decoder (error corrector) at the receiving end.

The encoder receives of a certain number of strings of k information symbols (information to be transmitted) as input and supplies strings of n symbols, with n>k, as an output. The receiver receives the strings of n symbols, which may be more or less corrupted by the transmission channel, and reconstructs the k symbols of the information string.

In other words, the receiver compensates for the errors introduced by the channel on the basis of the n−k redundancy symbols added during transmission. If, for example, the symbols are bits, there are $2^k$ possible strings of information. Each of the $2^k$ strings of code corresponds to each string. The code is therefore these $2^k$ words of n bits, as a whole.

The linearity consists of the fact that the combination (the sum, for example) of two code strings/words is also a code string.

As can be imagined, the correcting capacity of the code depends (as well as on its structure), on the length (n) and on the number of redundant symbols (n−k). Generally speaking, performance rises as (n−k) increases and, the k/n ratio being equal, it rises as the length (n) increases.

To complete the description, a definition of systematic code is also provided. A "systematic code" is defined as a code that allows the (k) information symbols to pass through unaltered and adds the (n−k) parity symbols.

The procedure for calculating the n−k parity symbols starting from the k information symbols is well known, and is a linear operation.

The interleaving of two linear block codes with the aim of achieving a correcting capacity higher than that of conventional linear block codes, as in so-called Product Vector Codes (PVC's), is a known procedure. The main disadvantage of PVC's consists in the limitations of the rectangular interleaver (in which the code words are the rows and the columns of the structure, thus in order to pass from one code to another code the interleaver writes by rows and reads by columns and vice versa).

Block code structures with unprotected dual redundancy are also known. The disadvantage of such code structures is that they provide a lower code correcting capacity. Indeed, while the information symbols are bi-protected, the parity/redundancy symbols are not.

Finally, partially protected block code structures with double redundancy that only partly solve the problem of the lowered correcting capacity of the code are known.

SUMMARY OF THE INVENTION

The main object of this invention is providing a method for carrying out error correction with a high correcting capacity.

A further object of this invention is that of providing a method for carrying out error correction using an interleaver that is simplified as compared with the known ones.

Yet another object of this invention is that of providing a method for carrying out error correction in which each parity is protected, thus giving rise to a completely bi-protected or even n-protected block code, in which the redundancies protect each other.

A further object of this invention is that of making the size of the code more flexible, avoiding the constraints that characterise PVC's.

A further object of this invention is that of providing a simplified processing algorithm, so as to simplify the hardware as compared with the known systems.

According to the present invention, these and other objects are achieved by means of a code with double and reciprocal protection, in which the interleaver is obtained by carrying out a permutation within columns and, possibly, a permutation between columns.

The structure can furthermore be generalized to cases in which there are more than two protections.

According to a preferred embodiment of the invention, in the interleaver the permutation within the columns comprises a rotation of the elements of the columns.

According to a preferred embodiment of the invention, a permutation is carried out between columns on the redundancies.

According to a preferred embodiment of the invention, the code provides bi-protection of the redundant symbols.

The length of the superblock will be given by the length of one of the codes (the two codes both have the same length n) multiplied by an arbitrary parameter.

The present invention becomes clear from the following detailed description, to be read with reference to the attached figures.

BRIEF DESCRIPTION OF THE DRAWINGS

In the drawings:

FIG. 1 shows a structure of a systematic Product Vector code with protection of the redundancies;

FIG. 2a shows the structure of a block code with double redundancy without protection of the redundancies;

FIGS. 3a and 3b show a possible implementation of this invention with two sets of redundancies, in which rotation by one within each column is carried out on the data and on the redundancy symbols;

FIG. 3c, associated with FIG. 3a, shows a variation of the embodiment illustrated in FIG. 3b in which one of the possible exchanges of columns is carried out on the redundancy;

BEST MODE FOR CARRYING OUT THE INVENTION

Reference should be made initially to FIG. 1, which shows the structure of a systematic Product Vector Code. Given two codes with parameters (n1,k1) e (n2,k2), the Product Vector Code organises the symbols into a two-dimensional table (n1×n2) in which the n2 rows are code words (having a length of n1) and the n1 columns are code words (having a length of n2).

One of the disadvantages of PVC's lies in the limitations of the rectangular interleaver. Furthermore, one is forced to take the product of the two lengths (N=n1×n2, K=k1×k2) as the length of the superblock. In addition, because of these constraints, an effective supercode is often not obtained.

FIG. 2 shows the structure of a block code with double redundancy without protection of the redundancies. This structure provides for calculation of two sets (A and B) of redundancy symbols calculated by rows. It is, basically, a PVC missing the bottom right-hand corner which carries the cross-check parities.

The structure of FIG. 2a is advantageous in terms of rate (since it is not necessary to transmit the "Check on Check" parity symbols). The basic disadvantage is that while the information symbols are bi-protected, the parity/redundancy symbols are not. It is therefore sufficient for a pattern of errors that cannot be corrected to occur on the parity (on parity A for example) to make the whole block uncorrectable.

Figure 2B:
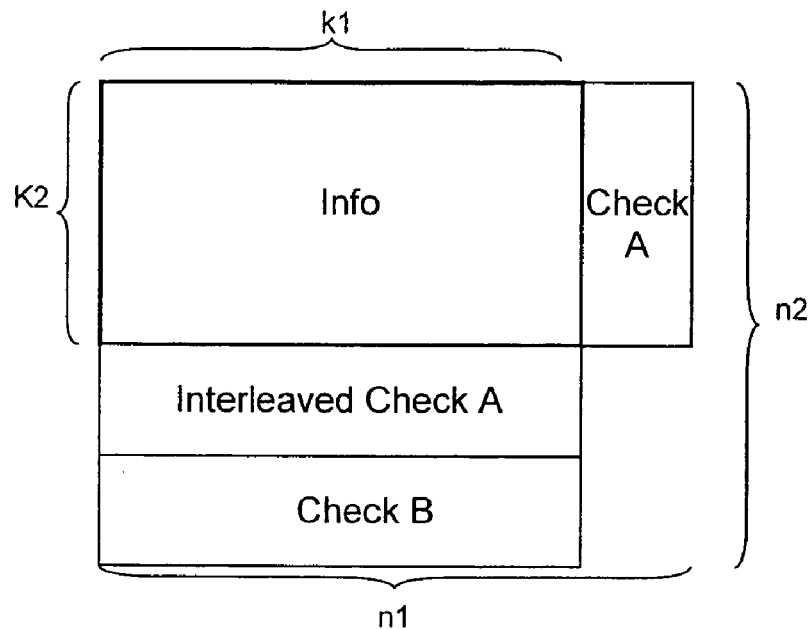
FIG. 2b shows a partially protected block code with double redundancy (interleaved redundancy A is protected by redundancy B)

FIG. 2b shows an example of a partially protected block code with double redundancy (the first set of symbols A is protected but the other set of symbols B is not protected). It must be noted that redundancy A is only transmitted once. The only constraint, in this case, is that n2 must be smaller than n1, that is to say the number of rows must be smaller than or equal to the length of the code.

In the case of a partially protected block code with double redundancy, the problem of the fragility of the code is partly solved: the codes have different lengths, ( ), and (only the) parity A is bi-protected. First of all parity A is calculated and then, after the interleaving of parity A by columns, parity B is calculated.

The invention consists in the interleaving of two (or more) LBC's to obtain a super-LBC that is far longer than the two starting codes, and therefore results in a high correcting capacity. The present invention is proposed as an alternative to the PVC, and its main features are a lower complexity and the non-existence of particular constraints in terms of length and rate, which are typical, on the other hand, of a PVC. This invention also has the advantage that it can be extended to a multidimensional code rather than being limited to bi-dimensional codes.

According to this invention, the construction of the code is obtained by means of two consecutive operations, i.e. a first operation for generating the interleaver and a second operation for constructing the self-protected parities of the code. For the sake of simplicity and clarity, the two operations will be described separately.

Interleaver:

Generally speaking, the object of any interleaver is to combine the elements in such a way that the number of elements that the codes have in common is as small as possible.

Figures 3A, 3B, 3C:
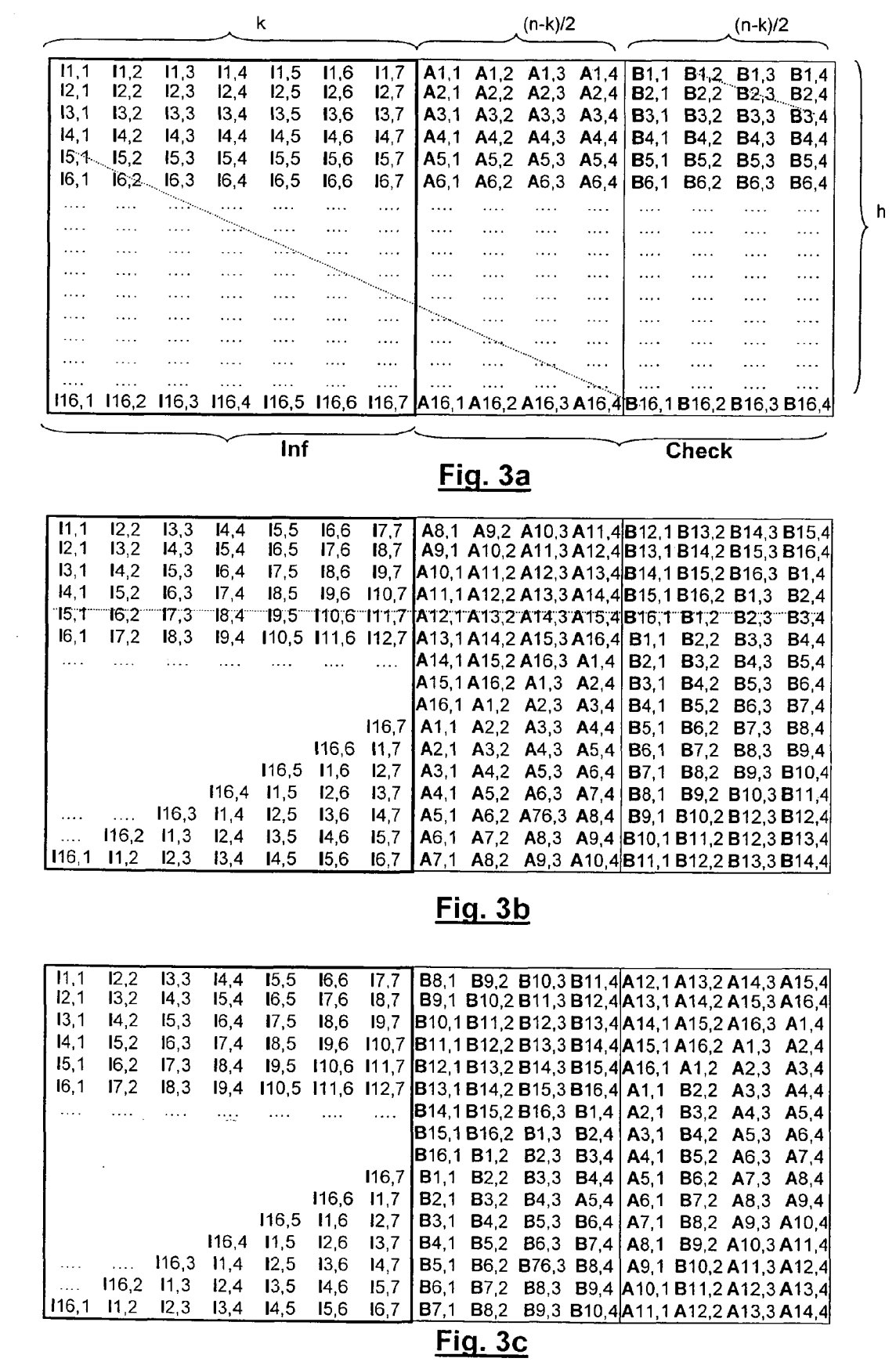

FIG. 3a shows a block of data/information Inf to be sent by means of a generic transmission system which intrinsically produces transmission errors. The data/information block is made up of a certain number h (equal, in this specific case, to 16) of strings of symbols (I1,1 I1,2 I1,3 . . . I1,7; I2,1 I2,2 I2,3 . . . I2,7; . . . ; I16,1 I16,2 I16,3 . . . I16,7) having a length k, in this example k=7. The Check block with the parity (redundancy) symbols is added to the data block and is made up of a number (n–k)·h of parity symbols (in the example, (15–7)·16). For the sake of simplicity only, without wishing to affect the general scope of the invention, the same number of parity symbols has been chosen, i.e. 4 columns (of 16 rows) are for parity A and 4 columns (of 16 rows) are for parity B. There is nothing to prevent different numbers from being considered for each of the parities A and B.

According to a possible embodiment of this invention (see FIGS. 3b and 3c which show two possible types of interleaving, without and with an exchange of columns respectively), the data block is interleaved by carrying out a permutation within each of the columns, that is to say by exchanging the positions of the elements within each column individually. Conveniently, for the sake of simplicity of construction and description, the permutation within each of the columns may consist of a rotation of the elements. The rotation is in any case a sub-class of permutations.

In the example, the order of the elements in the first column is not altered ("rotation 0"); in the second column a "rotation by 1" is carried out (the second element is moved to the first row); in the third column a "rotation by 2" is carried out (the third element is moved to the first row); . . . in the seventh column a "rotation by 6" is carried out (the seventh element is moved to the first row).

The block of redundancy symbols (with redundancies A and B) is interleaved in the same way: for example, a "rotation by 7" is carried out in the eighth column and a "rotation by 14" is carried out in the fifteenth column.

FIG. 3c shows how it would be possible, if required, to carry out a permutation between columns for the parity Check block (the columns of symbols A are exchanged with the columns of symbols B). In any case, depending on the column in which the parity symbols are situated, a corresponding rotation is carried out. For the data, on the other hand, permutation between columns is not carried out since it would not bring about any improvement in the performance of the code.

The data block that is actually transmitted is the one shown in FIG. 3a. The block shown in FIGS. 3b or 3c illustrates clearly that the same data block is read in a different manner by code words. In other words, according to this invention, the code words consist of first horizontal sequences of symbols of the block [Inf+Check], for example I1,1 I1,2 I1,3 . . . B1,4 or I6,1 I6,2 I6,3 . . . B6,4 and of second horizontal sequences of symbols of the interleaved block [Inf+Check], for example I1,1 I2,2 I3,3 . . . B15,4 or I5,1 I6,2 I7,3 . . . B3,4 (if FIG. 3b is considered), or I1,1 I2,2 I3,3 . . . A15,4 or I5,1 I6,2 I7,3 . . . A3,4 (if the same sequences are considered with reference to FIG. 3c). These same second sequences of symbols can also obviously be read in FIG. 3a by following a diagonal path and "moving upwards" in the column subsequent to the one of the element at the lower end of the diagonal itself.

The code word symbols occupy a sequence of positions herein referred to as a "path". Path "i" is given by the sequence row $f(i,j)$ column j, with j=1, 2, 3, ... n. Each of the h rows is a code word having a length n and a redundancy (n−k)/2; each of the h paths is also a code word having a length n and a redundancy (n−k)/2.

The interleaver according to this invention defines the permutations (which can, in particular, be rotations) and it therefore defines the path trajectories. Clearly, the function $f(\cdot)$ defines the structure of the interleaver. For example, paths along the diagonals are obtained with the following formula:

$$f(i,j)=(i-1+j-1)\text{MOD}h+1$$

with j=1, 2, 3 ... n and i=1, 2, 3, ... h

It will therefore be understood that this "super code" is systematic (it lets the k·h information symbols pass through unaltered and simply adds the (n−k)·h parity symbols.

This invention, advantageously, achieves the object of equalizing the robustness of all the symbols of the code so that there are no areas more fragile than others, by introducing the use of the rotating interleaver. The sequence of rotations is, theoretically, generic, provided it keeps the number of intersections to a minimum. It is reiterated that, as a generalization, the rotations are in fact generic permutations.

The two parities (parity A and parity B) are constructed in such a way that they can protect each other. In the example, the parities are of the same size, although it is possible to have parities of different sizes. Parity B is calculated by rows, having as its input one row of information symbols and one de-interleaved row of Parity A (FIG. 3a). Vice versa, in FIG. 3c, parity A is also calculated by rows, but having as the input one interleaved row of information symbols and one row of interleaved Parity B. It must be noted that the permutation on columns has been carried out only on the parity and not on the data. As will be seen, to obtain this loop, it is necessary to solve a linear system.

In FIG. 3b, parity B serves both for the code of FIG. 3a and for the code of FIG. 3b with the exception of an interleaving+the addition of redundancy A which enables the code to be constructed.

Figure 4A:
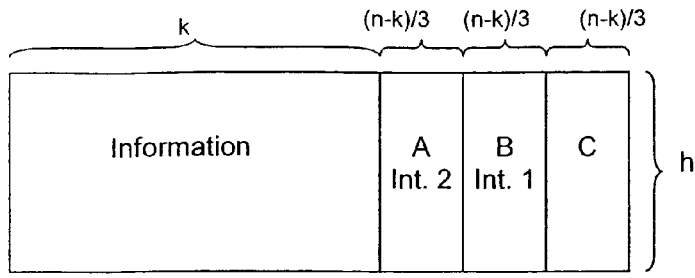
FIGS. 4a–4c illustrate schematically a possible embodiment of this invention with three sets of redundancies.
Figure 4B:
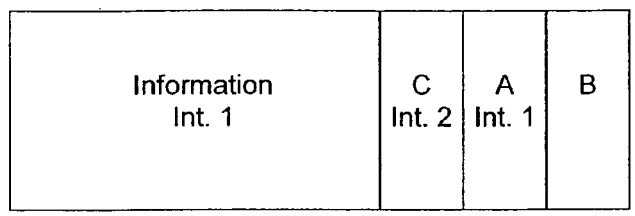
Figure 4C:
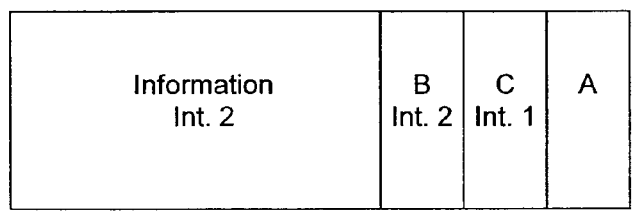

It must be noted that the process can be extended to more than two concatenated codes, three for example (using two different interleavers simultaneously). Again in this case, for practical reasons only, redundancies A, B, C have the same lengths. This situation is illustrated schematically in FIGS. 4a, 4b and 4c.

In the illustrated example, parity C (FIG. 4a) is calculated by rows, having as its input one row of information symbols, one row of Parities A interleaved through a second interleaver and one row of Parities B interleaved through a first interleaver. Parity B (FIG. 4b) is calculated by rows, having as its input one row of information symbols interleaved through the first interleaver, one row of Parity A interleaved through the first interleaver and one row of Parity C interleaved through the second interleaver. Lastly, parity A (FIG. 4c) is calculated by rows, having as its input a row of information symbols interleaved through the second interleaver, one row of Parities C interleaved through the first interleaver and one row of parities B interleaved through the second interleaver. It is in any case clear that the interleaver on the parities may differ from the interleaving on the information.

Construction of the Self-Protected Parities of the Code (In Transmission):

Having dealt extensively with the interleaver, the problem of constructing the self-protected parities will now be considered. In the case of two blocks of parities (two blocks of parities for the sake of simplicity and in order to be consistent with FIGS. 3a, 3c), it is necessary to find two sets of columns of parities such that both the rows and the paths are code words. Similarly, in the case of x blocks of parities, the x sets of columns having parities such that both the rows and the paths are code words must be found.

Since the code is linear, we exploit this linearity, that is to say we apply the additive property of the code words. The second group of columns of parities is given by the contribution of the data parities (P1 if the parity is per rows or P2 if the parity is per paths) plus the contribution of the parities of the first group of columns Y (AY if the parity is per rows or BY if the parity is per paths). The A and B matrixes depend on the code and on the interleaver and can be calculated by means of known techniques.

Let us now find Y, that is to say the symbols in the first group of columns, such that $$P1+A\cdot Y=P2+B\cdot Y$$

(A and B are square matrixes with (n−k)/2·h rows and (n−k)/2·h columns)

The following results:

$$Y=(A-B)^{-1}\cdot(P2-P1)$$

Therefore Y will be the first set of columns and P1+AY will be the second set.

Naturally, in order to calculate Y it shall be possible to reverse the matrix (A−B) (otherwise the system cannot be solved). In order to make it possible to reverse the matrix (A−B), degrees of freedom are available consisting of the choice of the interleaver and the choice of the two codes.

Figure 2C:
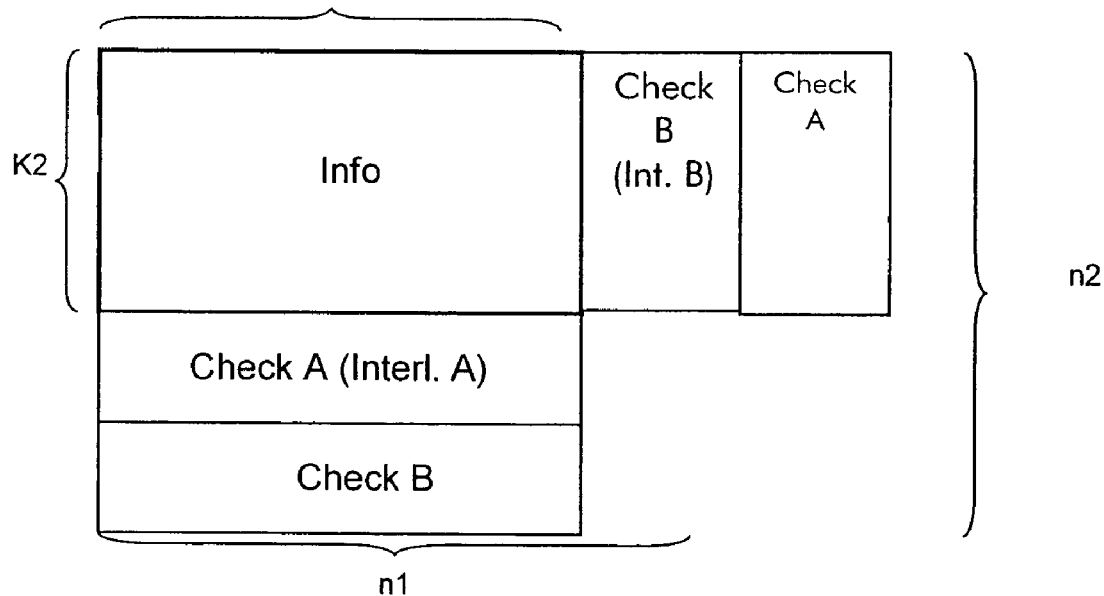
FIG. 2c shows an example of a block code with mutually protected double redundancy (interleaved redundancy A is protected by redundancy B and interleaved redundancy B is protected by redundancy A)

The same principle as above is applicable to various different types of interleaver, including the rectangular interleaver (see, for example, FIG. 2c). FIG. 2c shows a "shortened" PVC in which the two redundancies protect each other mutually. In the same way, this property is obtained by solving a linear system. It will be understood that this aspect is totally new as compared with the situation shown in FIG. 2b and originates directly from this invention.

Figure 5:
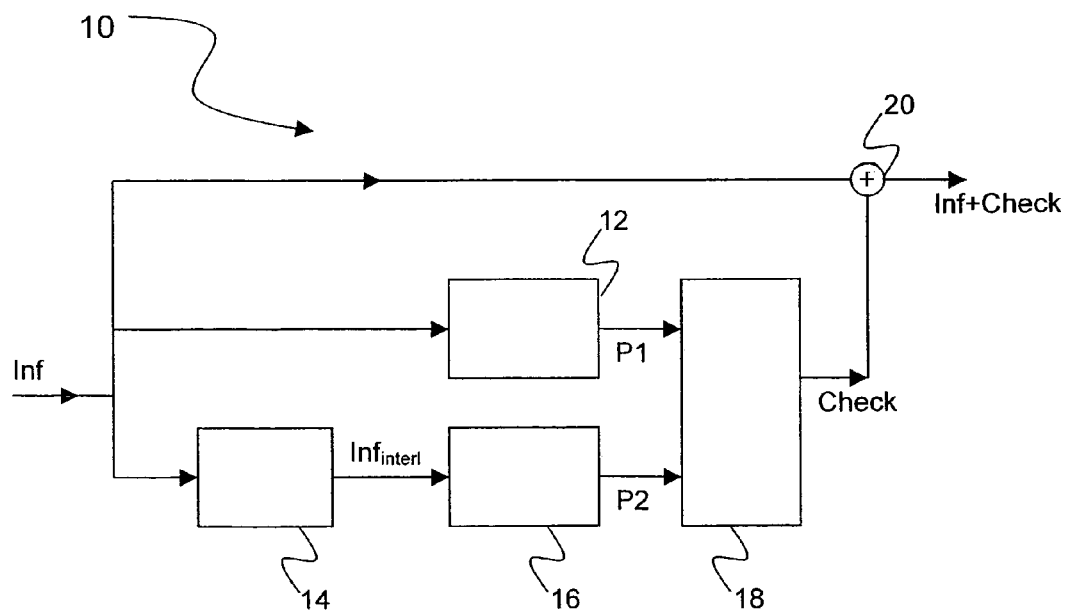
FIG. 5 shows an encoder according to a preferred embodiment of the invention, with two sets of redundancies.

With reference to FIG. 5, which shows an encoder 10 according to this invention (in this case, a two-dimensional encoder), Y is calculated in a functional block 18 that acts as a linear combiner. The device shown in FIG. 5 receives an input signal (data) to be transmitted. The signal is organised in frames with h rows and k information symbols for each row. The frames are sent to a first Short Block Coding 12 which receives the input streams of k symbols of consecutive rows and produces a first sequence of (n−k)/2 redundancy symbols (P1 as already defined). Each first sequence of redundancy symbols refers to a corresponding row of the frame.

The frames are also sent to an interleaver 14 in which the streams of k symbols of consecutive rows are submitted to vertical interleaving (within the single columns) with cyclic vertical shifting of the symbols of a column as compared with the symbols of the previous column (if simple rotation is implemented). Subsequently, the interleaved frames are sent as inputs to a second Short Block Coding 16 that produces a second sequence of (n−k)/2 redundancy symbols (P2). Each second sequence of redundancy symbols refers to a corresponding diagonal path in the frame.

The outputs from the first and from the second Short Block Coding 12, 16 are sent as inputs to the linear combiner 18. Using the formulae indicated above, the linear combiner 18 produces a total of (n−k)·h redundancy symbols which are, indeed, the redundancy part to be added (adder 20) to the data frame proper in order to obtain the desired code.

Generally speaking, if more than two blocks of redundancy are envisaged (three or four, for example), one or two (or more) corresponding additional branches must be envisaged with an interleaver and a Short Block Coding, whose output feeds the linear combiner 18. The additional interleaver may be identical to (but it may also differ from) the interleaver 14.

It should be explained that the linear system referred to above is not solved by the linear combiner, instead, it is calculated beforehand in the design stage.

The process described above is entirely general, regardless of the structure of the interleaver, which implicitly defines the matrices A and B and the calculation of P1 and P2.

In any case, making a suitable choice of interleaver (function f(i,j)) can make the calculation of Y very simple. For example, it is possible to make A and B block diagonals resulting in a localisation of the calculations.

Structure of the Code (Receiving Side):

Decoding is an iterative process that has been widely dealt with in literature. It consists, in the simplest of cases, of applying alternately the decoder for rows and the decoder for paths a certain number of times. If the number of errors introduced by the channel does not exceed the correcting capacity of the code, the word that was transmitted is reconstructed perfectly.

In any case, from the point of view of the decoder, this code has the same properties as a Product Vector Code. Only the paths on which the code words are found change. Therefore, correction algorithms applied to the Product Vector Code, which are known in literature, can conveniently be used.

There have thus been shown and described a novel method and a novel device for implementing a linear block code which fulfil all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

We claim:

1. A method for implementing a multidimensional linear block code on a frame of information symbols (Inf) to be transmitted through a transmission system, the information symbols being organised in a frame with a number (k) of columns and a number (h) of rows, the method comprising the steps of:

adding to the frame of information symbols (Inf) a number (n−k) of columns of redundancy symbols (Check) having a length (h) equal to the number of rows of the frame of symbols to be transmitted, to obtain rows of information symbols and redundancy symbols forming first code words, and interleaving the frame of information symbols and redundancy symbols, using permutation of the elements within the columns, such that rows of information symbols and redundancy symbols produced from the permuted columns form second code words.

2. The method according to claim 1, wherein said step of carrying out a permutation of the elements of the columns comprises a rotation of the elements of each column.

3. The method according to claim 2, wherein each column is rotated by a number of elements equal to the progressive number of the column itself less one.

4. The method according to claim 1, wherein it further comprises the step of carrying out a permutation between columns.

5. The method according to claim 4, characterised in that the permutation between columns is carried out only on the columns of redundancy symbols.

6. The method according to claim 1, wherein the redundancy symbols are organized in two or more blocks of redundancy symbols.

7. An encoder suitable for receiving as its input a frame of information symbols to be transmitted through a transmission system and for producing as its output information symbols and redundancy symbols for correcting any transmission errors at the receiving end, said encoder including:

input means for receiving information symbols organised in a frame with a number (k) of columns and a number (h) of rows;

a first Short Block Coding that receives the information symbols and produces a first sequence of ((n−k)h/2) redundancy symbols, the encoder further comprising:

at least one interleaver that receives the information symbols and produces corresponding interleaved information symbols;

at least one second Short Block Coding that receives the interleaved information symbols and produces a second sequence of ((n−k)h/2) redundancy symbols;

a linear combiner that receives the first and at least the second sequence of redundancy symbols and produces a total of ((n−k)h) redundancy symbols; and an adder that adds the information symbols and the redundancy symbols.

8. The encoder according to claim 7, wherein said interleaver carries out a permutation of the columns.

9. The encoder according to claim 8, wherein said interleaver carries out a rotation of the elements within each column, the rotation being by a progressive number obtained by decreasing the index of each column by one.

* * * * *

UNITED STATES PATENT AND TRADEMARK OFFICE
CERTIFICATE OF CORRECTION

| | |
|---|---|
| PATENT NO. | : 7,127,658 B2 |
| APPLICATION NO. | : 10/622551 |
| DATED | : October 24, 2006 |
| INVENTOR(S) | : Silvio Cucchi and Carlo Costantini |

It is certified that error appears in the above-identified patent and that said Letters Patent is hereby corrected as shown below:

Col. 8 lines 56-57
<u>Please add the following claim</u>:

10.  The encoder according to claim 7, wherein means are provided for carrying out a permutation of columns.

Signed and Sealed this

Second Day of January, 2007

JON W. DUDAS
*Director of the United States Patent and Trademark Office*